US009478614B2

(12) United States Patent
Onozawa et al.

(10) Patent No.: US 9,478,614 B2
(45) Date of Patent: Oct. 25, 2016

(54) SEMICONDUCTOR DEVICE

(71) Applicant: FUJI ELECTRIC CO., LTD., Kawasaki-shi (JP)

(72) Inventors: Yuichi Onozawa, Matsumoto (JP); Yusuke Kobayashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/822,791

(22) Filed: Aug. 10, 2015

(65) Prior Publication Data
US 2015/0349103 A1 Dec. 3, 2015

Related U.S. Application Data

(63) Continuation of application No. PCT/JP2014/071446, filed on Aug. 14, 2014.

(30) Foreign Application Priority Data

Aug. 15, 2013 (JP) ................. 2013-169015

(51) Int. Cl.
*H01L 29/94* (2006.01)
*H01L 31/062* (2012.01)
(Continued)

(52) U.S. Cl.
CPC ....... *H01L 29/0696* (2013.01); *H01L 29/0619* (2013.01); *H01L 29/407* (2013.01); *H01L 29/41708* (2013.01); *H01L 29/4238* (2013.01); *H01L 29/7397* (2013.01)

(58) Field of Classification Search
CPC ............... H01L 2924/13055; H01L 29/7393; H01L 29/4232; H01L 29/66325; H01L 29/7397; H01L 29/1095; H01L 29/7813; H01L 29/66734
USPC .......... 257/330, 341, 401, 560, 563
See application file for complete search history.

(56) References Cited

U.S. PATENT DOCUMENTS

| 5,329,142 A | 7/1994 | Kitagawa et al. |
| 9,236,460 B2 * | 1/2016 | Koyama ............. H01L 29/7393 |

(Continued)

FOREIGN PATENT DOCUMENTS

| EP | 2546882 A1 | 1/2013 |
| EP | 2613356 A2 | 7/2013 |

(Continued)

OTHER PUBLICATIONS

Yamaguchi, M. et al. "IEGT Design Criterion for Reducing EMI Noise", Proceedings of 2004 International Symposium on Power Semiconductor Devices and ICs (ISPSD '04), pp. 115-118, May 24-27, 2004.

(Continued)

*Primary Examiner* — Hsien Ming Lee
(74) *Attorney, Agent, or Firm* — Rabin & Berdo, P.C.

(57) ABSTRACT

A semiconductor device has mesa form first and second p-type base regions and a floating p-type region provided in a surface layer of an n−-type drift layer. The first p-type base region and floating p-type region are separated by a first trench. The second p-type base region is separated from the floating p-type region by a second trench. The first and second p-type base regions are conductively connected to an emitter electrode. The floating p-type region is in a floating state electrically isolated from the emitter electrode. A first gate electrode is provided via a first gate insulating film inside the first trench. An emitter potential second gate electrode is provided via a second gate insulating film inside the second trench. Therefore, di/dt controllability when turning on the semiconductor device can be increased.

17 Claims, 12 Drawing Sheets

(51) Int. Cl.
*H01L 27/12* (2006.01)
*H01L 21/331* (2006.01)
*H01L 29/06* (2006.01)
*H01L 29/417* (2006.01)
*H01L 29/739* (2006.01)
*H01L 29/40* (2006.01)
*H01L 29/423* (2006.01)

(56) References Cited

U.S. PATENT DOCUMENTS

| | | |
|---|---|---|
| 2001/0054738 A1 | 12/2001 | Momota et al. |
| 2004/0041171 A1 | 3/2004 | Ogura et al. |
| 2004/0084722 A1 | 5/2004 | Yamaguchi et al. |
| 2005/0045960 A1 | 3/2005 | Takahashi |
| 2005/0280078 A1 | 12/2005 | Teramae et al. |
| 2009/0189181 A1 | 7/2009 | Koyama et al. |

FOREIGN PATENT DOCUMENTS

| | | |
|---|---|---|
| JP | H05-243561 A | 9/1993 |
| JP | 2001-308327 A | 11/2001 |
| JP | 2004-153112 A | 5/2004 |
| JP | 2006-005248 A | 1/2006 |

OTHER PUBLICATIONS

Onozawa, Y. et al., "Development of the next generation 1200V trench-gate FS-IGBT featuring lower EMI noise and lower switching loss", Proceedings of the 19th International Symposium on Power Semiconductor Devices and IC's (ISPSD '07), pp. 13-16, May 27-30, 2007.

* cited by examiner ns of the n+-type emitter region 104 is selectively provided in the depth direction from the surface of the n+-type emitter region 104 is selectively provided inside the p-type layer 103. A trench 105 is provided penetrating the n+-type emitter region 104 and p-type layer 103 in the depth direction from the surface of the n+-type emitter region 104, reaching the n−-type drift layer 102. A gate electrode 107 is provided across a gate insulating film 106 inside the trench 105. The gate electrode 107 is electrically isolated from an emitter electrode 109 by an interlayer dielectric 108 that covers an upper portion of the gate electrode 107. The emitter electrode 109 is in conductive contact with a p-type base region 111, to be described

SEMICONDUCTOR DEVICE

CROSS-REFERENCE TO RELATED APPLICATIONS

This non-provisional application for U.S. Letters Patent is a Continuation of International Application PCT/JP2014/071446 filed Aug. 14, 2014, which claims priority from JP PA 2013-169015 filed Aug. 15, 2013, the entire contents of both of which are hereby incorporated by reference.

BACKGROUND OF THE INVENTION

1. Field of the Invention

The present invention relates to a semiconductor device.

2. Background of the Related Art

With the continuing reductions in power consumption in power conversion devices, there are considerable expectations for a reduction in power consumption in power devices that fulfill a central role in power conversion devices. Among these power devices, the use of voltage-driven insulated gate bipolar transistors (IGBTs) such that low on-state voltage can be realized by a conductivity modulation effect, and such that current can easily be controlled by the voltage applied to the insulated gate, is becoming widespread. Planar gate IGBTs and trench gate IGBTs are publicly known as these IGBTs.

A planar gate IGBT has a MOS gate (an insulated gate formed of metal-oxide-semiconductor) structure formed of a gate electrode provided on a substrate front surface. A trench gate IGBT has a MOS gate structure formed by a gate electrode (hereafter referred to as a trench gate) acting as a control electrode being embedded inside a trench provided on a substrate front surface side. As a trench gate IGBT is such that a channel is formed along both side walls of the trench, the channel density is greater, and the on-state voltage lower, than in a planar gate IGBT, wherein a channel is formed along the substrate front surface. Therefore, commercial applications for trench gate IGBTs have been increasing in recent years.

A description will be given of the configuration of a general trench gate IGBT, giving as an example an n-channel IGBT wherein a trench gate is disposed in a stripe form planar layout extending in a direction (the depth direction of the drawing, hereafter referred to as the longitudinal direction) perpendicular to the direction in which the trenches are aligned (hereafter referred to as the lateral direction). FIG. 7 is a sectional view showing the structure of a general trench gate IGBT. A section crossing the trench gate of the general trench gate IGBT in the lateral direction is shown in FIG. 7. As shown in FIG. 7, a p-type layer 103 is provided on the front surface side (n−-type drift layer 102 side) of a silicon substrate (semiconductor chip) formed by an n−-type drift layer 102 being deposited on the front surface of a p+-type semiconductor substrate that forms a p+-type collector region 101.

An n+-type emitter region 104 is selectively provided inside the p-type layer 103. A trench 105 is provided penetrating the n+-type emitter region 104 and p-type layer 103 in the depth direction from the surface of the n+-type emitter region 104, reaching the n−-type drift layer 102. A gate electrode 107 is provided across a gate insulating film 106 inside the trench 105. The gate electrode 107 is electrically isolated from an emitter electrode 109 by an interlayer dielectric 108 that covers an upper portion of the gate electrode 107. The emitter electrode 109 is in conductive contact with a p-type base region 111, to be described hereafter, and the n+-type emitter region 104 via contact holes provided in the interlayer dielectric 108.

The p-type layer 103 is divided by a plurality of the trench 105 into the p-type region (p-type base region) 111, in which the n+-type emitter region 104 is provided, and a p-type region of floating potential (hereafter referred to as a floating p-type region) 112, in which the n+-type emitter region 104 is not provided. The floating p-type region 112 is electrically isolated from the emitter electrode 109 by the interlayer dielectric 108, which covers the surface of the p-type layer 103. Also, the floating p-type region 112 is electrically isolated from the n−-type drift layer 102 by the p-n junction between the floating p-type region 112 and the n−-type drift layer 102, and is isolated from the gate electrode 107 by the gate insulating film 106. A collector electrode 110 is provided on the back surface of the p+-type semiconductor substrate.

Next, a description will be given of an operation at a time of turning on, when the trench gate IGBT shifts from an off-state to an on-state. Normally, the emitter electrode 109 is in a grounded state, or in a state wherein negative voltage is applied. The collector electrode 110 is in a state wherein positive voltage is applied. Even in a state wherein a voltage higher than that applied to the emitter electrode 109 is applied to the collector electrode 110 in this way, the p-n junction between the p-type base region 111 and n−-type drift layer 102 is reverse biased when voltage applied from a gate drive circuit (not shown) via a gate resistor to the gate electrode 107 is lower than a threshold value, because of which no current flows between the emitter and collector. That is, the IGBT maintains an off-state.

Meanwhile, when voltage exceeding the threshold value is applied from the gate drive circuit via the gate resistor to the gate electrode 107, a charge begins to accumulate in the gate electrode 107, simultaneously with which a region of the p-type base region 111 opposing the gate electrode 107 across the gate insulating film 106 inverts to n-type, whereby a channel region is formed. Therefore, electrons emitted from the emitter electrode 109 pass through an n-type region formed of the n+-type emitter region 104 and channel region, and are implanted into the n−-type drift layer 102. By electrons being implanted into the n−-type drift layer 102, the p-n junction between the p+-type collector region 101 and n−-type drift layer 102 is forward biased, and holes are implanted from the collector electrode 110 into the n−-type drift layer 102, because of which current flows between the emitter and collector. That is, the IGBT shifts to an on-state. The voltage drop between the emitter electrode 109 and collector electrode 110 in the on-state is the on-state voltage.

Next, a description will be given of an operation at a time of turning off, when the trench gate IGBT shifts from an on-state to an off-state. By the voltage applied to the gate electrode 107 (the voltage between the emitter electrode 109 and gate electrode 107) being reduced to the threshold value or lower, the charge accumulated in the gate electrode 107 is released toward the gate drive circuit via the gate resistor. At this time, by the portion of the p-type base region 111 inverted to n-type returning to p-type and the channel region disappearing, the supply of electrons from the emitter electrode 109 to the n−-type drift layer 102 stops. Therefore, the supply of holes from the collector electrode 110 to the n−-type drift layer 102 also stops, because of which electrons and holes accumulated inside the n−-type drift layer 102 are expelled into the collector electrode 110 and emitter electrode 109 respectively, or are annihilated owing to recombination, whereby the current stops flowing between the emitter and collector. That is, the IGBT shifts to an off-state.

Various configurations for further reducing the on-state voltage of the trench gate IGBT have been proposed. For example, an IGBT called an IEGT (Injection Enhanced Gate Bipolar Transistor), which includes a characteristic of a limit near the on-state voltage of a diode, is publicly known, for example, refer to PTL 1 (JP-A-5-243561, FIG. 101). An IEGT is such that an electron injection enhancement (IE) effect is increased by the area of contact between the n+-type emitter region and p-type base region and the emitter electrode being reduced by one portion of the surface of the n+-type emitter region and p-type base region being covered with an insulating film so that the portion covered with the insulating film and the emitter electrode do not come into contact.

Operations of the IEGT are basically the same as those of the heretofore described trench gate IGBT, but the IEGT is such that holes accumulated in the n--type drift layer in the vicinity of the p-type base region are unlikely to be expelled into the emitter electrode in the portion wherein the surface of the n+-type emitter region and p-type base region are covered with an insulating film, and holes accumulate in this portion. Therefore, the IEGT is such that the carrier concentration distribution of the n--type drift layer can be increased to a state near the carrier concentration distribution of a diode, and the on-state voltage can be reduced further than that of a normal trench gate IGBT.

However, as well as low on-state voltage, high-speed switching characteristics are also required of a power device used in a power conversion device, meaning that improvement of high-speed switching characteristics is also one important task. The IEGT is such that, as holes are unlikely to be expelled into the emitter electrode, switching characteristics are inferior to those of a normal trench gate IGBT. Also, as the trench gate IGBT and IEGT are such that trench gate structures are distributed densely, the gate-emitter capacity also increases. As heretofore described, it is necessary for the switching operations of the IGBT that a charge is accumulated in the gate-emitter capacitor when shifting from an off-state to an on-state, and that the charge accumulated in the gate-emitter capacitor is released when shifting from an on-state to an off-state.

Consequently, when the gate-emitter capacitance is high, there is an increase in the time for charging or discharging the gate-emitter capacitor when carrying out a switching operation, and switching loss also increases, because of which there is a problem in that there is an increase in the occurring loss of the power device. The occurring loss of the power device is the sum of steady loss determined by on-state voltage and switching loss occurring when carrying out a switching on-operation and off-operation. Therefore, reducing gate-emitter capacitance, which is a cause of switching loss occurring, is an important task. An IGBT including the floating p-type region 112 electrically isolated from the emitter electrode 109 by the interlayer dielectric 108, as shown in FIG. 7, has been proposed as an IGBT wherein this kind of problem is eliminated, for example, refer to PTL 2 (JP-A-2001-308327, FIG. 1).

In PTL 2, owing to the floating p-type region 112 being provided, holes implanted from the collector side into the n--type drift layer 102 when in an on-state are unlikely to be expelled into the emitter electrode 109. Therefore, holes accumulate in the floating p-type region 112, and the carrier concentration distribution of the n--type drift layer 102 is increased to a state near the carrier concentration distribution of a diode. Also, in PTL 2, the gate-emitter capacitance is reduced by a trench gate structure that does not act as a control electrode not being provided in the floating p-type region 112, whereby a reduction in the time for charging and discharging and a reduction in switching loss are achieved.

Also, a device, which is a semiconductor substrate, including a plurality of cell structures that include a peripheral diffusion region formed on the outer side of an isolation structure, a base region formed inside an element region, divided by an isolated trench gate, and having an emitter region in a surface portion, and an emitter electrode connected to the emitter region and base region, a dummy base region, neighboring the cell structure, that is a base region that does not have an emitter region connected to the emitter electrode in a surface portion, and a connection portion that electrically connects the peripheral diffusion region to the emitter electrode, has been proposed as an IGBT such that ejection of residual carriers in a chip peripheral region when turning off is enhanced, and shutoff resistance is increased, for example, refer to PTL 3 (JP-A-2006-5248). The IGBTs of PTL 2 and 3 include a floating state mesa region sandwiched by trench gates that act as control electrodes.

However, it is reported as a problem common to the kinds of IGBT including the floating p-type region 112 shown in PTL 1 to 3 that there is room for improvement in the turn-on characteristics, for example, refer to NPL 1 (M. Yamaguchi and 7 others, "IEGT Design Criterion for Reducing EMI Noise", Proceedings of 2004 International Symposium on Power Semiconductor Devices & ICs, May, 2004, Pages 115 to 118) and NPL 2 (Y. Onozawa and 5 others, "Development of the next generation 1200V trench-gate FS-IGBT featuring lower EMI noise and lower switching loss", Proceedings of the 19th International Symposium on Power Semiconductor Devices & ICs (Cheju), May 27 to 30, 2007, Pages 13 to 16). An IGBT including the floating p-type region 112 is such that excess holes accumulate in the floating p-type region 112 when turning on, and the potential of the floating p-type region 112 rises. An input capacitor is charged by a displacement current caused by the potential rise (=C·dV/dt, wherein C is the capacitance (feedback capacitance) of the gate insulating film 106, and dV/dt is the temporal rate of change of the collector voltage), and the gate voltage rises, because of which switching speed when turning on increases. Normally, the switching speed (collector current rate of change di/dt) is controlled by inserting a gate resistor in series with the gate electrode 107, but in the case of an IGBT including the floating p-type region 112, there is a problem in that, even when the gate resistance is increased, the switching speed when turning on cannot be reduced to a predetermined value.

SUMMARY OF THE INVENTION

The invention, in order to eliminate the problem with the heretofore described existing technology, has an object of providing a semiconductor device wherein di/dt controllability when turning on is high.

In order to resolve the heretofore described problem, thereby achieving the object of the invention, a semiconductor device according to the invention has the following characteristics. A second conductivity type second semiconductor layer is provided on a first conductivity type first semiconductor layer. A first conductivity type third semiconductor layer is selectively provided in a surface layer of the second semiconductor layer on the side opposite to that of the first semiconductor layer. A second conductivity type fourth semiconductor layer is selectively provided inside the third semiconductor layer. A first trench penetrates the third semiconductor layer and fourth semiconductor layer to reach the second semiconductor layer. A first conductivity type fifth semiconductor layer is selectively provided in a surface layer of the second semiconductor layer on the side opposite to that of the first semiconductor layer. The fifth semiconductor layer is separated from the third semiconductor layer by the first trench. A second trench penetrates the fifth semiconductor layer to reach the second semiconductor layer. A first conductivity type sixth semiconductor layer is provided inside the fifth semiconductor layer. The sixth semiconductor layer is separated from the fifth semiconductor layer by the second trench. An emitter electrode is conductively connected to the third semiconductor layer, fourth semiconductor layer, and sixth semiconductor layer. Also, the emitter electrode is electrically isolated from the fifth semiconductor layer. A collector electrode is conductively connected to the first semiconductor layer. A first gate electrode is provided across a first gate insulating film inside the first trench. A second gate electrode is provided across a second gate insulating film inside the second trench. The second gate electrode is electrically connected to the emitter electrode.

Also, the heretofore described semiconductor device according to the invention is characterized in that the width of the sixth semiconductor layer is less than the width of the third semiconductor layer.

Also, the heretofore described semiconductor device according to the invention is characterized in that the first trench is disposed in stripe form, and the third semiconductor layer and fifth semiconductor layer extend linearly in parallel with the direction in which the stripe of the first trench extends.

Also, the heretofore described semiconductor device according to the invention is characterized in that the second trench is disposed linearly in parallel with the direction in which the stripe of the first trench extends, and the sixth semiconductor layer extends linearly in parallel with the direction in which the stripe of the first trench extends.

Also, the heretofore described semiconductor device according to the invention is characterized in that a plurality of the sixth semiconductor layer are disposed at predetermined intervals in the direction in which the stripe of the first trench extends, and the second trench is disposed so as to surround each of the plurality of the sixth semiconductor layer.

Also, the heretofore described semiconductor device according to the invention further has the following characteristics. A third trench penetrates the fifth semiconductor layer to reach the second semiconductor layer between the first trench and second trench. A third gate electrode is provided across a third gate insulating film inside the third trench. The third gate electrode is electrically connected to the emitter electrode. Further, the width of a portion of the fifth semiconductor layer sandwiched by the first trench and third trench is less than the width of the third semiconductor layer.

Also, the heretofore described semiconductor device according to the invention is characterized in that the depth of the fifth semiconductor layer is such that a first trench side portion is deeper than a second trench side portion, and a fifth semiconductor layer side bottom surface corner portion of the first trench is covered by the first trench side portion of the fifth semiconductor layer.

Also, the heretofore described semiconductor device according to the invention further has the following characteristics. A fourth trench penetrates the fifth semiconductor layer to reach the second semiconductor layer between the first trench and second trench. A fourth gate electrode is provided across a fourth gate insulating film inside the fourth trench. The fourth gate electrode is electrically connected to the emitter electrode. Further, the distance between the fourth trench and second trench is greater than the distance between the fourth trench and first trench.

Also, the heretofore described semiconductor device according to the invention is characterized by further including a second conductivity type seventh semiconductor layer, of an impurity concentration higher than that of the second semiconductor layer, provided between the third semiconductor layer and second semiconductor layer between neighboring first trenches.

According to the invention, a current channel for allowing excess holes accumulated in the floating state fifth semiconductor region when turning on to flow toward the emitter electrode can be formed along the inner wall of the second trench. Therefore, a displacement current generated due to excess holes being accumulated in the fifth semiconductor region when turning on can be prevented from flowing via the first gate insulating film into the first gate electrode, and a rise in gate voltage can thus be restricted.

Advantageous Effects of Invention

According to the semiconductor device according to the invention, an advantage is achieved in that it is possible to provide a semiconductor device wherein di/dt controllability when turning on is high, and switching time is short.

DETAILED DESCRIPTION OF THE INVENTION

Hereafter, referring to the attached drawings, a detailed description will be given of preferred embodiments of a semiconductor device according to the invention. A layer or region being prefixed by n or p in the description and attached drawings means that electrons or holes respectively are majority carriers. Also, + or − added to n or p indicates a higher impurity concentration or lower impurity concentration respectively than in a layer or region to which + or − is not added. In the following embodiment descriptions and attached drawings, the same reference signs are given to the same configurations, and redundant descriptions are omitted.

Embodiment 1

Figure 1:
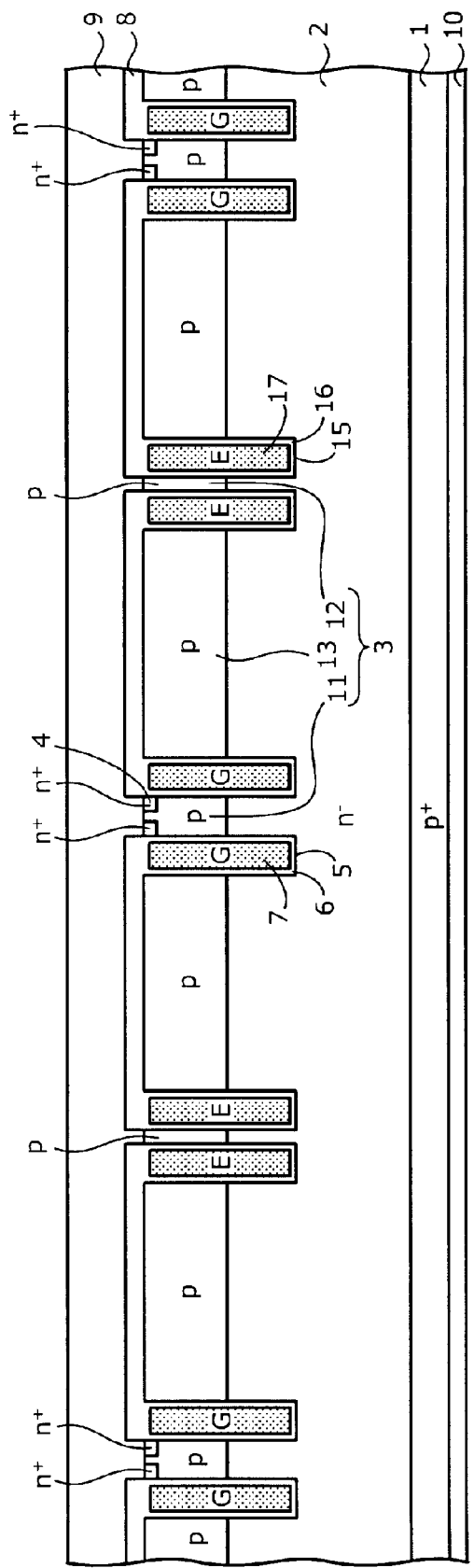
FIG. 1 is a sectional view showing the structure of a semiconductor device according to Embodiment 1.

A description will be given of the structure of a semiconductor device according to Embodiment 1, giving as an example an n-channel IGBT wherein a trench gate is disposed extending in stripe form in a direction (a longitudinal direction) perpendicular to the direction in which trenches are aligned (a lateral direction). FIG. 1 is a sectional view showing the structure of the semiconductor device according to Embodiment 1. FIG. 1 shows a section crossing the trench gate in the lateral direction (the same also applies to FIGS. 2, 3, and 5). The semiconductor device according to Embodiment 1 includes an active region (as shown in FIG. 1) through which current flows when in an on-state, and a termination structure portion (not shown) that relaxes an electrical field on the front surface side of a semiconductor chip, thereby maintaining breakdown voltage.

In the active region, a p-type layer 3 is provided in a surface layer of the front surface (the surface on the side of an n−-type drift layer 2 opposite to a p+-type collector region 1 side) of a semiconductor chip formed by the n−-type drift layer (second semiconductor layer) 2 being deposited on the front surface of a p+-type semiconductor substrate that forms the p+-type collector region (first semiconductor layer) 1. An n+-type emitter region (fourth semiconductor layer) 4 is selectively provided in a surface layer on the side opposite to the p+-type collector region 1 side inside the p-type layer 3. A trench (hereafter referred to as a first trench) 5 is provided penetrating the n+-type emitter region 4 and p-type layer 3 from the surface of the n+-type emitter region 4, reaching the n−-type drift layer 2.

The first trench 5 is disposed in, for example, a stripe form planar layout. Inside the first trench 5, a first gate insulating film 6 is provided along the inner wall of the first trench 5, and a first gate electrode 7 (trench gate) formed of, for example, polysilicon (poly-Si) is provided on the inner side of the first gate insulating film 6. The first gate electrode 7 acts as a control electrode. The p-type layer 3 is divided by the first trench 5 into a p-type region (hereafter referred to as a first p-type base region (third semiconductor layer)) 11, in which the n+-type emitter region 4 is provided, and a p-type region 13, in which the n+-type emitter region 4 is not provided.

The p-type region (hereafter referred to as a floating p-type region (fifth semiconductor layer)) 13 in which the n+-type emitter region 4 is not provided is electrically isolated from an emitter electrode 9, to be described hereafter, and is in a floating state. The first p-type base region 11 and floating p-type region 13 extend linearly in parallel between neighboring first trenches 5, in a direction (longitudinal direction) perpendicular to the direction in which the first trenches 5 are aligned. The first p-type base region 11 and floating p-type region 13 are, for example, repeatedly alternately disposed in the direction in which the first trenches 5 are aligned (lateral direction). The first p-type base region 11 is conductively connected to the emitter electrode 9, and an n-type inversion layer (channel), which forms a current path for the main current when in an on-state, is formed in a portion of the first p-type base region 11 along a side wall of the first trench 5.

A trench (hereafter referred to as a second trench) 15 is provided inside the floating p-type region 13, penetrating the floating p-type region 13 in the depth direction to reach the n−-type drift layer 2. The second trench 15 is disposed, for example, linearly in parallel with the longitudinal direction of the first trench 5. Also, two or more of the second trench 15 are disposed, for example, in the vicinity of a central point between neighboring first trenches 5. Inside the second trench 15, a second gate insulating film 16 is provided along the inner wall of the second trench 15, and a second gate electrode 17 formed of, for example, polysilicon is provided on the inner side of the second gate insulating film 16. The second gate electrode 17, for example, is in conductive contact with the emitter electrode 9 in the vicinity of the outer periphery of the chip (not shown), thus having emitter potential.

A p-type region (hereafter referred to as a second p-type base region (sixth semiconductor layer)) 12 isolated from the floating p-type region 13 by the second trench 15 is provided inside the floating p-type region 13. Specifically, the second p-type base region 12 is isolated from the floating p-type region 13 by being disposed sandwiched between neighboring second trenches 15. The second p-type base region 12 extends linearly in parallel with the direction in which the second trench 15 extends. FIG. 1 shows a case wherein two of the second trench 15 are disposed in the vicinity of a central point between neighboring first trenches 5. The second p-type base region 12 is conductively connected to the emitter electrode 9, and functions as a hole pickup that extracts holes accumulated in the floating p-type region 13 toward the emitter electrode 9 when turning on. Preferred conditions of the second p-type base region 12 and second trench 15 will be described hereafter.

The floating p-type region 13 is isolated from the first gate electrode 7 by the first gate insulating film 6, and isolated from the second gate electrode 17 by the second gate insulating film 16. Also, the floating p-type region 13 is electrically isolated from the n−-type drift layer 2 by the p-n junction between the floating p-type region 13 and the n−-type drift layer 2. Owing to the floating p-type region 13 being provided, holes implanted from the collector side into the n−-type drift layer 2 when in an on-state are unlikely to be expelled into the emitter electrode 9, and the carrier concentration distribution of the n−-type drift layer 2 can be increased to a state near the carrier concentration distribution of a diode (the IE effect), because of which the on-state voltage can be reduced.

In this way, the p-type layer 3 is divided by the first and second trenches 5 and 15 into the mesa-form first and second p-type base regions 11 and 12 and floating p-type region 13. The interlayer dielectric 8 covers an upper portion of the first and second gate electrodes 7 and 17 and the surface of the floating p-type region 13. The emitter electrode 9 is in conductive contact with the first p-type base region 11 and n+-type emitter region 4 via a first contact hole provided in the interlayer dielectric 8, and in conductive contact with the second p-type base region 12 via a second contact hole provided in the interlayer dielectric 8. The first and second contact holes are provided in, for example, stripe form extending in the longitudinal direction of the first and second trenches.

Also, the emitter electrode 9 is electrically isolated from the first gate electrode 7 and floating p-type region 13 by the interlayer dielectric 8. A passivation protective film (not shown) formed of, for example, a silicon nitride film (Si3N4 film) or amorphous silicon film is provided on the surface of the emitter electrode 9. The back surface of the p+-type semiconductor substrate (the back surface of the semiconductor chip) is conductively connected to a collector electrode 10. The termination structure portion is provided so as to surround the periphery of the active region. A voltage withstanding structure (not shown) such as, for example, a guard ring or field plate is provided in the termination structure portion on the front surface side of the semiconductor chip.

Figure 7:
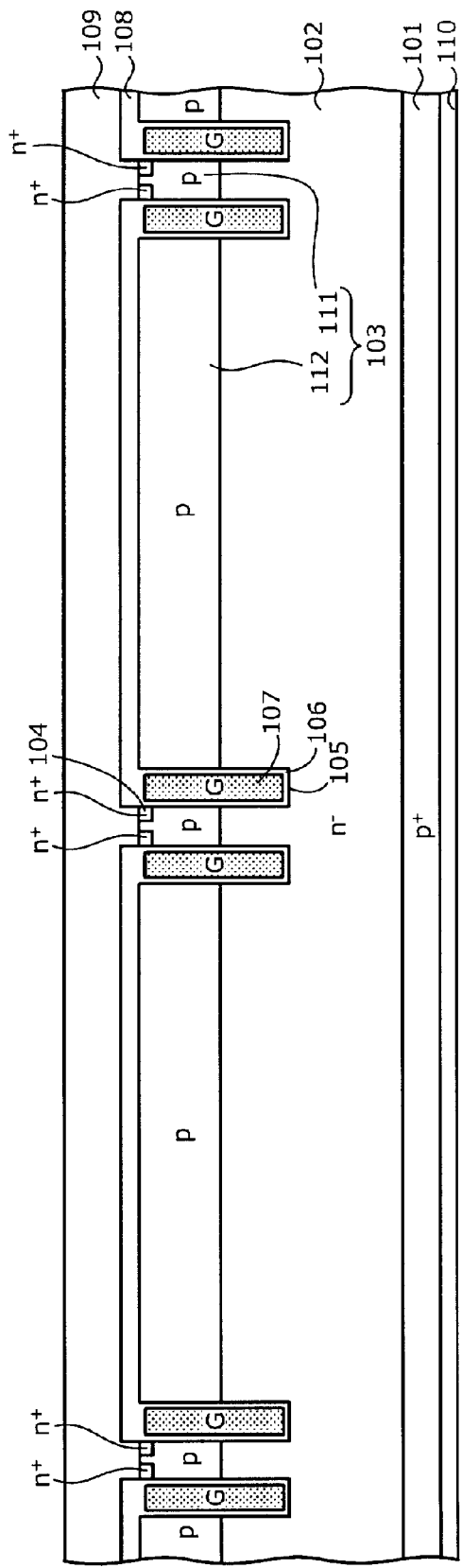
FIG. 7 is a sectional view showing the structure of a general trench gate IGBT.

Next, a description will be given of operations of the semiconductor device according to Embodiment 1. As operations at a time of turning on, when the semiconductor device according to Embodiment 1 shifts from an off-state to an on-state, and at a time of turning off, when the semiconductor device according to Embodiment 1 shifts from an on-state to an off-state, are the same as those of the heretofore described trench gate IGBT (refer to FIG. 7), a description will be omitted. The semiconductor device according to Embodiment 1 is such that, by the emitter potential second p-type base region 12 electrically isolated from the floating p-type region 13 by the second trench 15 being provided inside the floating p-type region 13, and the emitter potential second gate electrode 17 being provided across the second gate insulating film 16 inside the second trench 15, the turn-on time di/dt controllability can be increased with respect to that of the heretofore described trench gate IGBT. The reason for this is as follows.

When excess holes accumulate in the floating p-type region 13 when turning on, and the potential of the floating p-type region 13 rises above the potential (emitter potential) of the second gate electrode 17, the second gate insulating film 16 inside the second trench 15 is reverse biased, because of which an inversion layer of p-type (hereafter referred to as a p-type inversion layer, not shown) connecting the floating p-type region 13 and second p-type base region 12 is formed in a portion of the n--type drift layer 2 along the inner wall of the second trench 15. Therefore, the excess holes accumulated in the floating p-type region 13 are expelled through the p-type inversion layer and second p-type base region 12 toward the emitter electrode 9. The higher the potential of the floating p-type region 13, the higher the impurity concentration of the p-type inversion layer, which forms a current channel for extracting holes accumulated in the floating p-type region 13 (hole pickup), because of which the effect of extracting holes from the floating p-type region 13 further increases. Therefore, the rise in the potential of the floating p-type region 13 is restricted, because of which a rise in the gate voltage is restricted. Also, as hole current no longer concentrates in the floating p-type region 13, a rise in potential in the vicinity of the bottom surface of the first trench 5 can also be restricted. Meanwhile, the p-type inversion layer connecting the floating p-type region 13 and second p-type base region 12 is not formed in a steady on-state. Therefore, holes accumulated in the floating p-type region 13 can be prevented from flowing out, and the carrier concentration distribution of the n--type drift layer 2 can thereby be maintained in a state near the carrier concentration distribution of a diode. Therefore, it is possible to realize a low on-state voltage of the same extent as that when not providing the second p-type base region 12.

Next, a description will be given of preferred conditions of the second p-type base region 12 and second trench 15. It is good when the lateral direction width (hereafter referred to simply as the width) of the second p-type base region 12 is less than the width of the first p-type base region 11, preferably as small as possible based on the minimum dimension stipulated by the design criteria (design rules). The reason for this is as follows. A portion of the n--type drift layer 2 between neighboring second trenches 15 in which the p-type inversion layer is not formed is a region that does not contribute to the extraction of holes accumulated in the floating p-type region 13 when turning on. Therefore, by reducing the width of the second p-type base region 12 as far as possible, and increasing the area of the floating p-type region 13 by the amount by which the area of the region that does not contribute to hole extraction is reduced, the IE effect can be increased, and the on-state voltage can thus be reduced. Also, as holes accumulated in the floating p-type region 13 are more difficult to extract when in a steady on-state, a further reduction in on-state voltage can be achieved. Specifically, it is good when the width of the second p-type base region 12 is, for example, 1 μm or less, and preferably 0.5 μm or less.

Also, as the impurity concentration and depth of the second p-type base region 12 can be variously changed in accordance with the design criteria, it is sufficient to set taking into consideration the correlation of, for example, the di/dt controllability when turning on, low on-state voltage, breakdown voltage, and the like. Specifically, it is good when the impurity concentration and depth of the second p-type base region 12 are of practically the same extent as the impurity concentration and depth of the first p-type base region 11. In this case, the first p-type base region 11 and second p-type base region 12 can be formed simultaneously under the same conditions, and the manufacturing process can thus be simplified. The first and second p-type base regions 11 and 12 and floating p-type region 13 may be formed simultaneously under the same conditions. Furthermore, for example, by the impurity concentration of the second p-type base region 12 being of practically the same extent as the impurity concentration of the first p-type base region 11, breakdown voltage of practically the same extent can be maintained across the whole of the active region. Specifically, the peak impurity concentration of the second p-type base region 12 may be in the region of, for example, $1\times10^{17}/cm^3$. Also, the dose of the p-type impurity implanted into the n--type drift layer 2 in order to form the second p-type base region 12 may be in the region of, for example, $1\times10^{13}/cm^2$.

Also, by the depth of the second p-type base region 12 being less than the depth of the second trench 15, the length of a portion of the second trench 15 protruding toward the collector side from the interface between the second p-type base region 12 and n--type drift layer 2 increases, because of which holes accumulated in the floating p-type region 13 are difficult to extract when in a steady on-state, meaning that a further reduction in on-state voltage can be achieved. Also, an n-type region may be selectively provided inside the second p-type base region 12 and, provided that a decrease in breakdown voltage can be avoided, an n-type region of an impurity concentration low enough that a p-type inversion layer is formed along the inner wall of the second trench 15 may be provided instead of the second p-type base region 12. In this case too, holes accumulated in the floating p-type region 13 are difficult to extract when in a steady on-state, because of which a further reduction in on-state voltage can be achieved. When an n-type region is selectively provided inside the second p-type base region 12, it is good when the n-type region is provided from the vicinity of the center of the second p-type base region 12 toward the collector side. The reason for this is that when an n-type region is selectively provided on the emitter side of the second p-type base region 12, there is concern that a thyristor formed of the p+-type collector region 1, n--type drift layer 2, second p-type base region 12, and n-type region will be turned on, and latch-up occur.

The depth of the second trench 15 may be of the same extent as the depth of the first trench 5. In this case, a trench gate structure formed of the second trench 15, second gate insulating film 16, and second gate electrode 17 is of practically the same configuration as a trench gate structure formed of the first trench 5, first gate insulating film 6, and first gate electrode 7. Therefore, the trench gate structure formed of the first trench 5, first gate insulating film 6, and first gate electrode 7 and the trench gate structure formed of the second trench 15, second gate insulating film 16, and second gate electrode 17 can be simultaneously formed using a general MOS gate structure formation method, and the manufacturing process can thus be simplified.

Also, the depth of the second trench 15 may be greater than the depth of the first trench 5. The reason for this is that the longer the length of the portion of the second trench 15 protruding toward the collector side from the interface between the second p-type base region 12 and n--type drift layer 2, the more difficult holes accumulated in the floating p-type region 13 are to extract when in a steady on-state, because of which a further reduction in on-state voltage can be achieved. Specifically, the depth of the second trench 15 may be in the region of, for example, 5 μm or more, 10 μm or less. Also, the width of the second trench 15 may be in the region of, for example, 2 μm or more, 3 μm or less.

As heretofore described, according to Embodiment 1, by an emitter potential second p-type base region isolated from a floating p-type region by a second trench being provided inside the floating p-type region, and an emitter potential second gate electrode being provided inside the second trench, a current channel for allowing excess holes accumulated in the floating p-type region when turning on to flow toward the emitter electrode is formed, and the excess holes accumulated in the floating p-type region can thus be expelled toward the emitter electrode. Therefore, the potential of the floating p-type region can be prevented from rising, and a rise in gate voltage is thus restricted. Consequently, as the switching speed when turning on can be controlled by, for example, gate resistance, in the same way as heretofore known, a semiconductor device with high turn-on time di/dt controllability can be realized.

Embodiment 2

Figure 2:
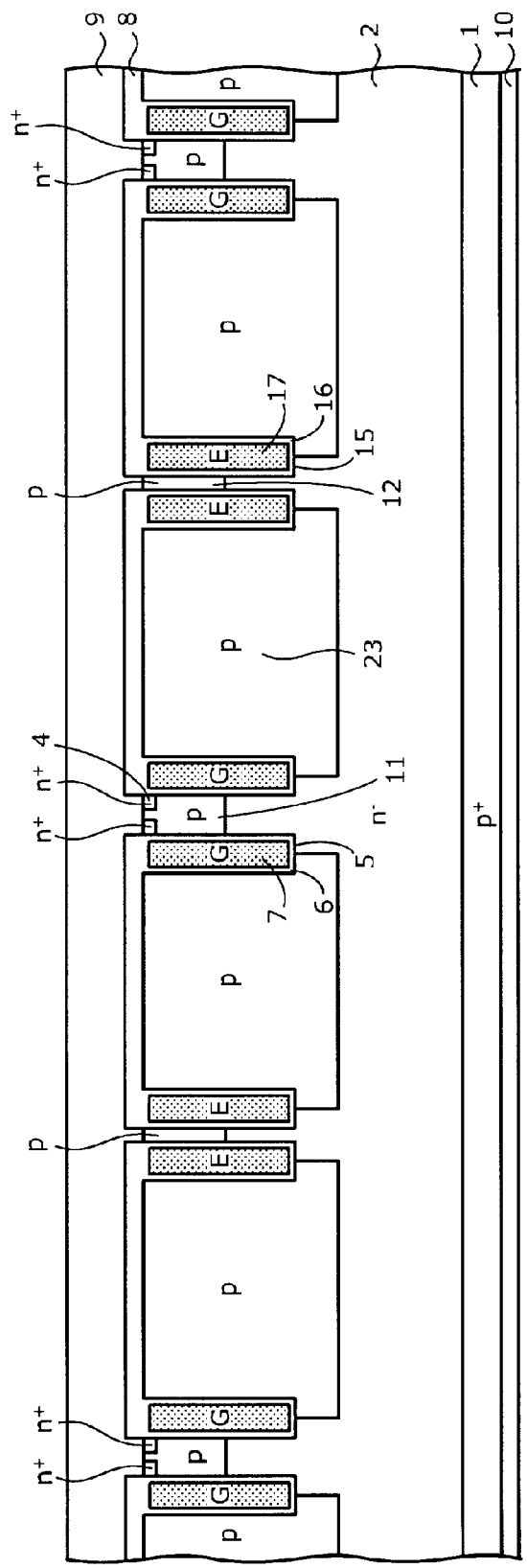
FIG. 2 is a sectional view showing the structure of a semiconductor device according to Embodiment 2.

Next, a description will be given of the structure of a semiconductor device according to Embodiment 2. FIG. 2 is a sectional view showing the structure of the semiconductor device according to Embodiment 2. The semiconductor device according to Embodiment 2 differs from the semiconductor device according to Embodiment 1 in that the depth of a floating p-type region 23 is greater than the depth of the first and second trenches 5 and 15. The floating p-type region 23 covers a bottom surface corner portion on the floating p-type region 23 side of the first trench 5, and covers a bottom surface corner portion on the floating p-type region 23 side of the second trench 15. It is sufficient that this kind of floating p-type region 23 is formed simultaneously with, for example, a guard ring (not shown) configuring a termination structure portion.

As heretofore described, according to Embodiment 2, the same advantages as in Embodiment 1 can be obtained. Also, according to Embodiment 2, an electrical field in the vicinity of the bottom surfaces of the first and second trenches can be relaxed, because of which breakdown voltage can be increased.

Embodiment 3

Figure 3:
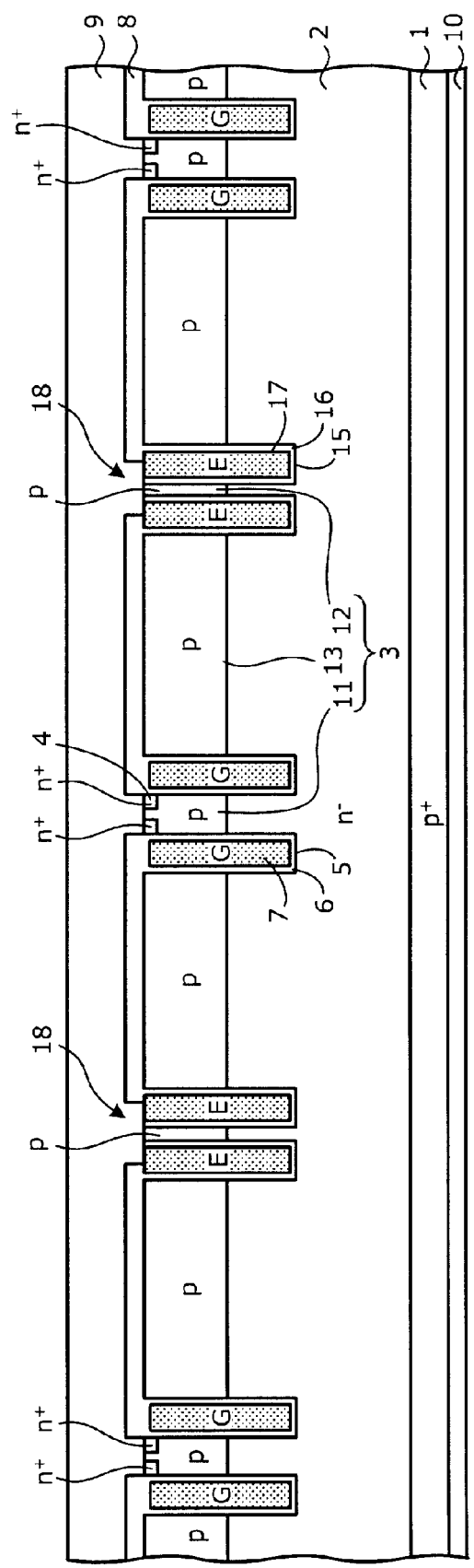
FIG. 3 is a sectional view showing the structure of a semiconductor device according to Embodiment 3.

Next, a description will be given of the structure of a semiconductor device according to Embodiment 3. FIG. 3 is a sectional view showing the structure of the semiconductor device according to Embodiment 3. The semiconductor device according to Embodiment 3 differs from the semiconductor device according to Embodiment 1 in that contact (electrical contact) between the second p-type base region 12 and emitter electrode 9 and contact between the second gate electrode 17 and emitter electrode 9 are carried out in the same place.

Specifically, the upper surface of the second gate electrode 17 is not covered by the interlayer dielectric 8. A second contact hole 18 provided in the interlayer dielectric 8 is wider than the second p-type base region 12, and the second gate electrode 17 and second p-type base region 12 are exposed in the second contact hole 18. The emitter electrode 9 is in conductive contact with the second gate electrode 17 and second p-type base region 12 via the second contact hole 18. By the second p-type base region 12 and second gate electrode 17 being brought into conductive contact with the emitter electrode 9 via the same second contact hole 18 in this way, the reliability of the semiconductor device can be increased, even when the width of the second p-type base region 12 is as small as possible. The reason for this is as follows.

When the widths of the second contact hole 18 and second p-type base region 12 are of the same extent, the smaller the width of the second p-type base region 12, the higher the positioning accuracy and etching accuracy required when forming the second contact hole 18 in the interlayer dielectric 8. As opposed to this, in Embodiment 3, the width of the second contact hole 18 is greater than the width of the second p-type base region 12, because of which the second p-type base region 12 can be exposed in the second contact hole 18 with greater accuracy than when the widths of the second contact hole 18 and second p-type base region 12 are of the same extent, even when a certain amount of deviation occurs in the formation position of the second contact hole 18 or the width of the second contact hole 18. Consequently, the second p-type base region 12 and emitter electrode 9 can be brought into conductive contact more reliably than when the widths of the second contact hole 18 and second p-type base region 12 are of the same extent.

As heretofore described, according to Embodiment 3, the same advantages as in Embodiments 1 and 2 can be obtained. Also, according to Embodiment 3, a second p-type base region can be accurately exposed in a second contact hole, because of which the width of the second p-type base region can be reduced, thus increasing the advantage of preventing the on-state voltage from rising when turning on.

Embodiment 4

Figure 4:
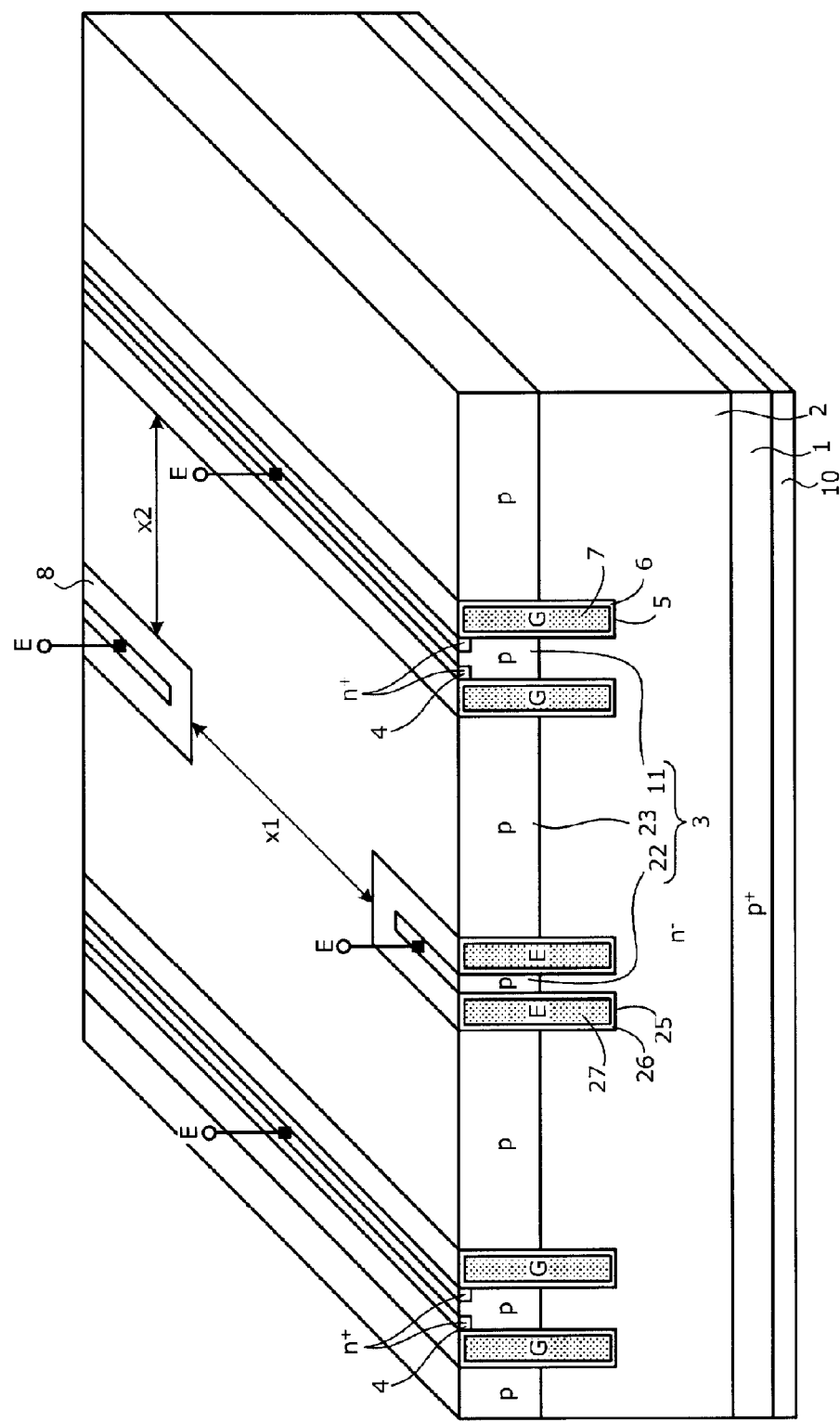
FIG. 4 is a perspective view showing the structure of a semiconductor device according to Embodiment 4.

Next, a description will be given of the structure of a semiconductor device according to Embodiment 4. FIG. 4 is a perspective view showing the structure of the semiconductor device according to Embodiment 4. The semiconductor device according to Embodiment 4 differs from the semiconductor device according to Embodiment 3 in that a second trench 25 in which an emitter potential second gate electrode 27 is embedded is locally disposed in the direction (longitudinal direction) in which the first trench 5 extends in stripe form. Specifically, the second trench 25 has a planar form of, for example, a polygonal frame (shown as a rectangular frame in FIG. 4) that encloses a second p-type base region 22, and is disposed at a predetermined interval x1 in the longitudinal direction of the first trench 5. Reference sign 26 is a second gate insulating film.

Of the p-type layer 3, not only a portion sandwiched between the first trench 5 and second trench 25 but also a portion sandwiched between second trenches 25 neighboring in the longitudinal direction of the first trench 5 form the floating p-type region 23. That is, the area of the floating p-type region 23 can be increased further than when providing the second trench in stripe form parallel to the first trench 5, while maintaining the width of the second p-type base region 22. It is good when the interval x1 between second trenches 25 neighboring in the longitudinal direction of the first trench 5 is, for example, of the same extent as an interval x2 between the neighboring first trench 5 and second trench 25. The reason for this is that the effect of extracting holes accumulated in the floating p-type region 23 can be generated practically uniformly over the whole of the floating p-type region 23.

As heretofore described, according to Embodiment 4, the same advantages as in Embodiments 1 and 2 can be obtained. Also, according to Embodiment 4, the advantage of preventing the on-state voltage from rising when turning on can be increased, without reducing the width of the second p-type base region.

Embodiment 5

Figure 5:
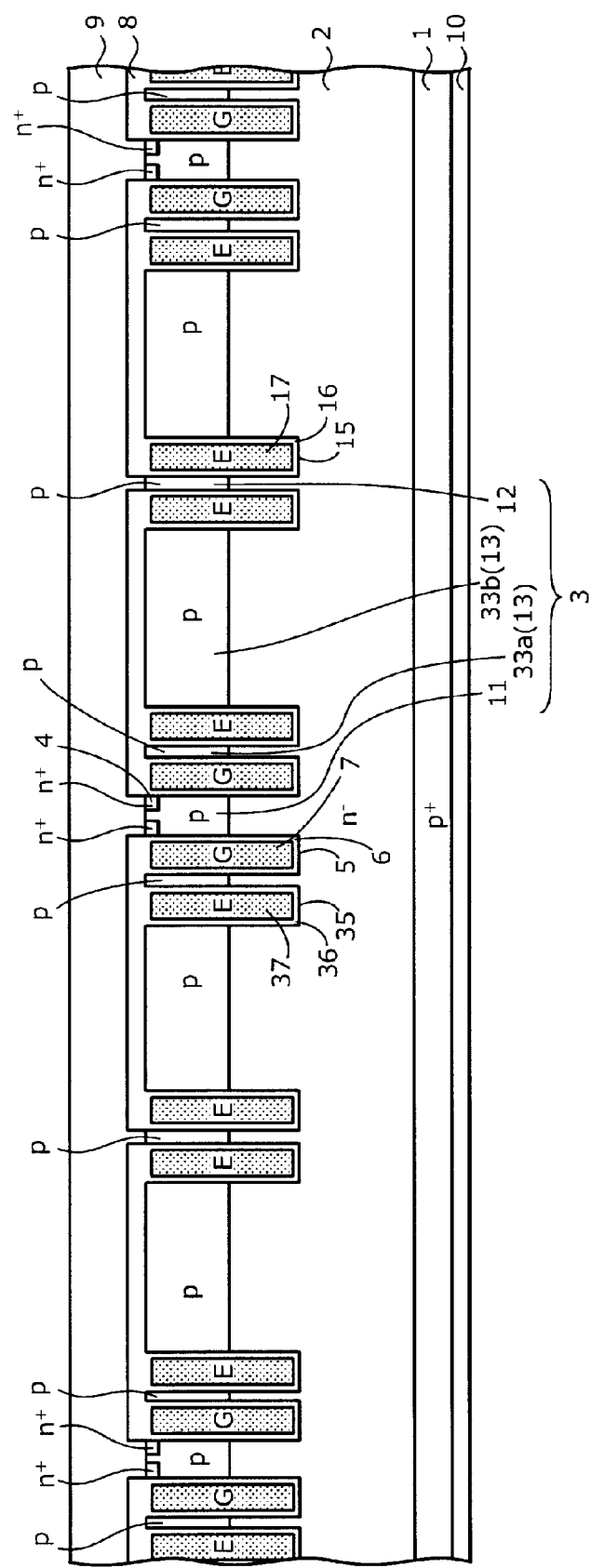
FIG. 5 is a sectional view showing the structure of a semiconductor device according to Embodiment 5.

Next, a description will be given of the structure of a semiconductor device according to Embodiment 5. FIG. 5 is a sectional view showing the structure of the semiconductor device according to Embodiment 5. The semiconductor device according to Embodiment 5 differs from the semiconductor device according to Embodiment 1 in that a third trench 35 in which an emitter potential third gate electrode 37 is embedded is provided inside the floating p-type region 13, distanced from the first trench 5, in the vicinity of the first trench 5 in which the first gate electrode 7 (trench gate) is embedded.

Specifically, the third trench 35 penetrates the floating p-type region 13 in the depth direction, reaching the n−−type drift layer 2. The third trench 35 is provided in, for example, stripe form parallel to the first trench 5. Inside the third trench 35, a third gate insulating film 36 is provided along the inner wall of the third trench 35, and a third gate electrode 37 formed of, for example, polysilicon, is provided on the inner side of the third gate insulating film 36. The third gate electrode 37, for example, is in conductive contact with the emitter electrode 9 in the vicinity of the outer periphery of the chip (not shown), thus having emitter potential.

It is good when the width of a portion of the floating p-type region 13 sandwiched between the first trench 5 and third trench 35 (hereafter referred to as a first floating p-type region 33a) is as small as possible based on the minimum dimension stipulated by the design criteria. The reason for this is as follows. In a general trench gate IGBT that does not include a floating p-type region, the capacitance of a portion of the trench gate opposing the collector electrode, that is, the gate insulating film on the bottom surface of the trench, is the feedback capacitance. The semiconductor device according to the invention is such that, owing to the floating p-type region 13 being provided, not only the capacitance of the first gate insulating film 6 on the bottom surface of the first trench 5 but also the capacitance of the first gate insulating film 6 on the side wall on the floating p-type region 13 side of the first trench 5 is the feedback capacitance, because of which the feedback capacitance is greater than in a general trench gate IGBT. In order to improve the switching characteristics, it is preferable that feedback capacitance is small. In Embodiment 5, by the width of the first floating p-type region 33a being reduced as far as possible, the first gate insulating film 6 on the side wall on the floating p-type region 13 side of the first trench 5 is shielded by the third gate electrode 37. Therefore, the capacitance of the first gate insulating film 6 in a portion shielded by the third gate electrode 37 can be the gate-emitter capacitance, and as the capacitance is not the feedback capacitance, the switching characteristics can be improved. Specifically, it is good when the width of the first floating p-type region 33a is, for example, 1 µm or less, and preferably 0.5 µm or less. Reference sign 33b is a portion of the floating p-type region 13 sandwiched by the second trench 15 and third trench 35.

As heretofore described, according to Embodiment 5, the same advantages as in Embodiments 1 and 2 can be obtained. Also, according to Embodiment 5, the feedback capacitance can be reduced, because of which switching time can be shortened. Consequently, switching characteristics can be improved.

Embodiment 6

Figure 6:
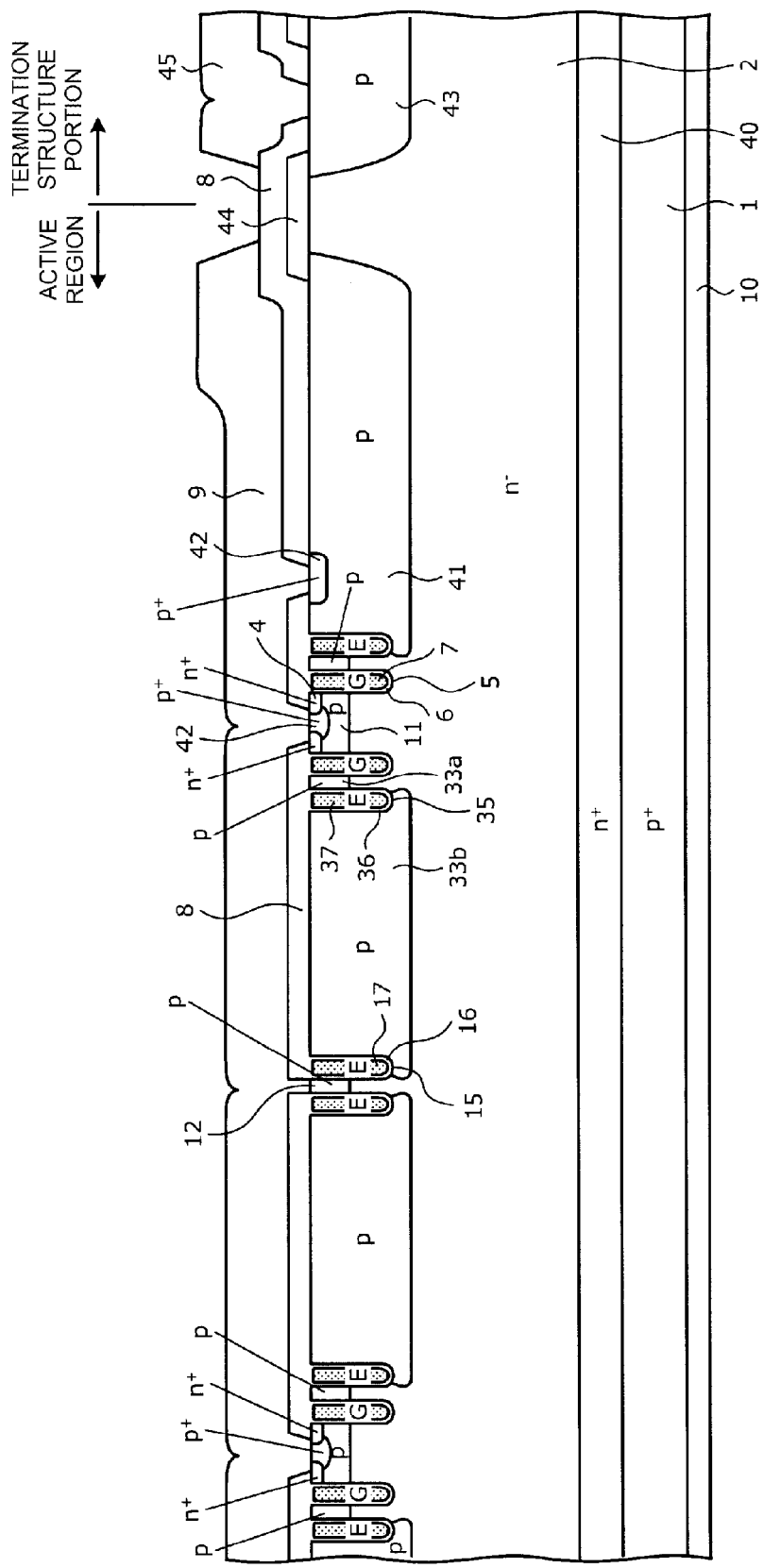
FIG. 6 is a sectional view showing the structure of a semiconductor device according to Embodiment 6.

Next, a description will be given of the structure of a semiconductor device according to Embodiment 6. FIG. 6 is a sectional view showing the structure of the semiconductor device according to Embodiment 6. The semiconductor device according to Embodiment 6 differs from the semiconductor device according to Embodiment 5 in that the depth of a portion of the floating p-type region 13 sandwiched between the second trench 15 and third trench 35 (hereafter referred to as a second floating p-type region) 33b is greater than the depth of the first to third trenches 5, 15, and 35. The second floating p-type region 33b covers the bottom surfaces on the second floating p-type region 33b side of the second and third trenches 15 and 35. When the second floating p-type region 33b is formed to a depth greater than that of the first to third trenches 5, 15, and 35 in this way, it is sufficient that the second floating p-type region 33b is formed simultaneously with, for example, a third p-type base region 41 on the outermost periphery of the active region, or a guard ring 43 configuring a termination structure portion.

The third p-type base region 41 on the outermost periphery of the active region is connected to the emitter electrode 9 via a p+-type contact region 42. A field plate extended from the emitter electrode 9 is formed on the interlayer dielectric 8, which covers the surface of the third p-type base region 41 on the outermost periphery of the active region. The guard ring 43 is provided in the termination structure portion, in a surface layer of the semiconductor chip front surface (the surface of the n−−type drift layer 2 on the side opposite to the p+-type collector region 1 side). An oxide film 44 is provided on the front surface of the semiconductor chip in the termination structure portion. A field plate 45 is provided on the oxide film 44, and the field plate 45 is in conductive contact with the guard ring 43 via a contact hole provided in the oxide film 44. Reference sign 40 is an n+-type field stop region.

As heretofore described, according to Embodiment 6, the same advantages as in Embodiments 1, 2, and 5 can be obtained.

Embodiment 7

Figure 8:
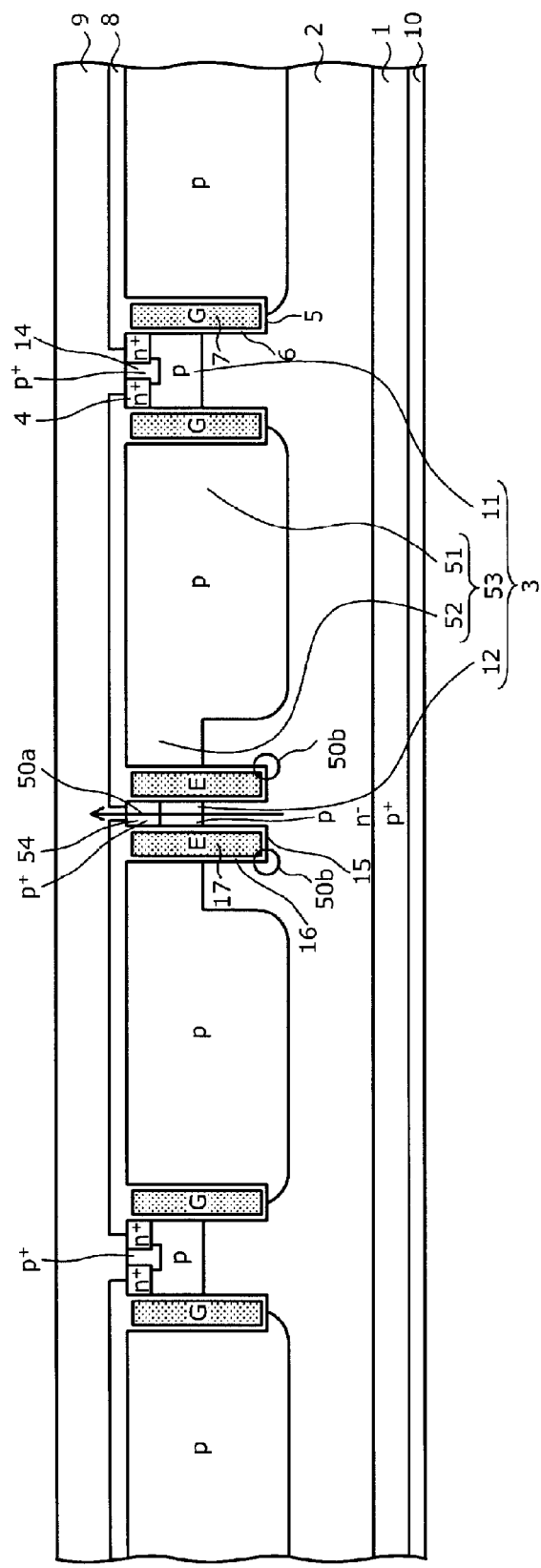
FIG. 8 is a sectional view showing the structure of a semiconductor device according to Embodiment 7.

Next, a description will be given of the structure of a semiconductor device according to Embodiment 7. FIG. 8 is a sectional view showing the structure of the semiconductor device according to Embodiment 7. The semiconductor device according to Embodiment 7 differs from the semiconductor device according to Embodiment 2 in that the depth of a portion (hereafter referred to as a first trench 5 side deep portion) 51 on the first trench 5 side of a floating p-type region 53 is greater than the depth of the first trench 5, while the depth of a portion (referred to as a second trench 15 side shallow portion) 52 on the second trench 15 side of the floating p-type region 53 is less than the depth of the second trench 15. By the first trench 5 side deep portion 51 of the floating p-type region 53 being brought close to the first p-type base region 11 and distanced from the second p-type base region 12 (that is, by the second trench 15 side shallow portion 52 of the floating p-type region 53 being provided), the breakdown voltage of the second p-type base region 12 is lower than the breakdown voltage of the first p-type base region 11, and breakdown occurs in the second p-type base region 12.

Specifically, the first trench 5 side deep portion 51 of the floating p-type region 53 is a portion of the floating p-type region 53 that opposes the first gate electrode 7 across the first gate insulating film 6 provided on the side wall of the first trench 5. The p-n junction plane between the first trench 5 side deep portion 51 of the floating p-type region 53 and n--type drift layer 2 and the bottom surface of the first trench 5 are positioned at practically the same depth from the substrate front surface. Therefore, a depletion layer spreading to the n--type drift layer 2 side from the p-n junction between the floating p-type region 53 and n--type drift layer 2 is practically flat along the p-n junction plane between the first trench 5 side deep portion 51 of the floating p-type region 53 and n--type drift layer 2 and the bottom surface of the first trench 5. That is, by a floating p-type region 53 side bottom surface corner portion of the first trench 5 being covered by the first trench 5 side deep portion 51 of the floating p-type region 53, electrical field concentration at the floating p-type region 53 side bottom surface corner portion of the first trench 5 is relaxed. Therefore, the breakdown voltage of the first p-type base region 11 is increased.

Meanwhile, the second trench 15 side shallow portion 52 of the floating p-type region 53 is a portion of the floating p-type region 53 that opposes the second gate electrode 17 across the second gate insulating film 16 provided on the side wall of the second trench 15. The p-n junction plane between the second trench 15 side shallow portion 52 of the floating p-type region 53 and n--type drift layer 2 is in a position less deep than the bottom surface of the first trench 5 from the substrate front surface. Therefore, a depletion layer spreading to the n--type drift layer 2 side from the p-n junction between the floating p-type region 53 and n--type drift layer 2 is in a curved state along the p-n junction plane between the second trench 15 side shallow portion 52 of the floating p-type region 53 and n--type drift layer 2 and the second trench 15. That is, by a floating p-type region 53 side bottom surface corner portion 50b of the second trench 15 not being covered by the floating p-type region 53, electrical field concentration is liable to occur at the floating p-type region 53 side bottom surface corner portion 50b of the second trench 15, and avalanche breakdown is liable to occur in the portion in which the electrical field is concentrated. Therefore, the breakdown voltage of the second p-type base region 12 is lower than the breakdown voltage of the first p-type base region 11, and breakdown when overvoltage is applied occurs preferentially in the second p-type base region 12.

When breakdown occurs in the second p-type base region 12, a hole current (avalanche current) 50a caused by the breakdown passes through the second p-type base region 12 (and a p+-type contact region 54 provided inside the second p-type base region 12) to the emitter electrode 9. As no n-type region is provided inside the second p-type base region 12, no parasitic thyristor latch-up occurs. Also, as breakdown when overvoltage is applied can be caused to occur in the second p-type base region 12, it is possible to prevent a large current from flowing through the first p-type base region 11 (and a p+-type contact region 14 provided inside the first p-type base region 11) to the emitter electrode 9. Therefore, a parasitic thyristor formed of the p+-type collector region 1, n--type drift layer 2, first p-type base region 11, and n+-type emitter region 4 does not operate. Consequently, overvoltage resistance can be increased. Also, by overvoltage resistance being increased, short-circuit resistance and cosmic radiation resistance can be increased.

In order to form the first trench 5 side deep portion 51 of the floating p-type region 53, it is sufficient that, for example, an ion implantation of a p-type impurity for forming the floating p-type region 53 is carried out biased to the first trench 5 side. Specifically, an ion implantation mask in which is opened a portion corresponding to the formation region of the first trench 5 side deep portion 51 of the floating p-type region 53 is formed on the substrate front surface. Next, with the ion implantation mask as a mask, an ion implantation of a p-type impurity for forming the floating p-type region 53 is carried out. By so doing, a p-type impurity region that forms the floating p-type region 53 is formed in a position in the n--type drift layer 2 reaching the formation region of the first trench 5 in a horizontal direction (a direction perpendicular to the depth direction) of the formation region of the floating p-type region 53, and not reaching the formation region of the second trench 15 in the horizontal direction. Next, after the ion implantation mask for forming the floating p-type region 53 is removed, the first and second trenches 5 and 15 are formed using photolithography and etching.

Owing to the formation of the first trench 5, the p-type impurity region that forms the floating p-type region 53 is exposed in a side wall of the first trench 5. Next, the p-type impurity region that forms the floating p-type region 53 is caused to diffuse by thermal processing. At this time, the first trench 5 side of the p-type impurity region is already in a state exposed in a side wall of the first trench 5, and as such is diffused only in the depth direction. Meanwhile, the second trench 15 side of the p-type impurity region is diffused in a horizontal direction until exposed in a side wall of the second trench 15. That is, the first trench 5 side deep portion 51 of the floating p-type region 53 is formed on the first trench 5 side of the p-type impurity region by the diffusion in the depth direction of the p-type impurity region. The second trench 15 side shallow portion 52 of the floating p-type region 53 is formed on the second trench 15 side of the p-type impurity region by the diffusion in the horizontal direction of the p-type impurity region. By changing the ion implantation mask in this way, the floating p-type region 53 can be formed without adding a new step.

As it is sufficient that the first trench 5 side deep portion 51 of the floating p-type region 53 is disposed distanced from the second trench 15, the distance between the first trench 5 side deep portion 51 of the floating p-type region 53 and the second trench 15 can be variously changed. Also, in a configuration wherein the depth of the floating p-type region 23 is uniformly greater than the depth of the first trench 5, as in Embodiment 2 (FIG. 2), the depth of the second trench 15 may be greater than the depth of the floating p-type region 23. Owing to the depth of the second trench 15 being greater than the depth of the first trench 5 in this way, the configuration is such that a floating p-type region side bottom surface corner portion of the first trench 5 is covered by the floating p-type region while a floating p-type region side bottom surface corner portion of the second trench 15 is not covered by the floating p-type region, because of which the breakdown voltage of the second p-type base region 12 is lower than the breakdown voltage of the first p-type base region 11, and breakdown can be caused to occur in the second p-type base region 12. When the depth of the second trench 15 is greater than the depth of the first trench 5, it is sufficient that, for example, the width of the second trench 15 is greater than the width of the first trench 5. Therefore, the first and second trenches 5 and 15 of differing depths can be formed simultaneously with one etching.

As heretofore described, according to Embodiment 7, the same advantages as in Embodiments 1 and 2 can be obtained. Also, according to Embodiment 7, by a first trench side deep portion of a floating p-type region being brought close to a first p-type base region and distanced from a second p-type base region, breakdown can be caused to occur in the second p-type base region. Therefore, there is no latch-up of a unit cell (a functional unit of an element) parasitic thyristor, because of which breakdown resistance when overvoltage is applied can be increased. Also, according to Embodiment 7, breakdown can be caused to occur in the second p-type base region of the active region, because of which the breakdown voltage of the active region can be lower than the breakdown voltage of a termination structure portion. Therefore, breakdown is unlikely to occur in the termination structure portion, because of which breakdown resistance when overvoltage is applied can be increased. Also, in general, there is concern that the greater the number of trenches, the further yield will drop due to process fluctuation, but according to Embodiment 7, overvoltage resistance can be increased without increasing the number of trenches. Therefore, manufacturing risk can be reduced, which is preferable.

Embodiment 8

Figure 9:
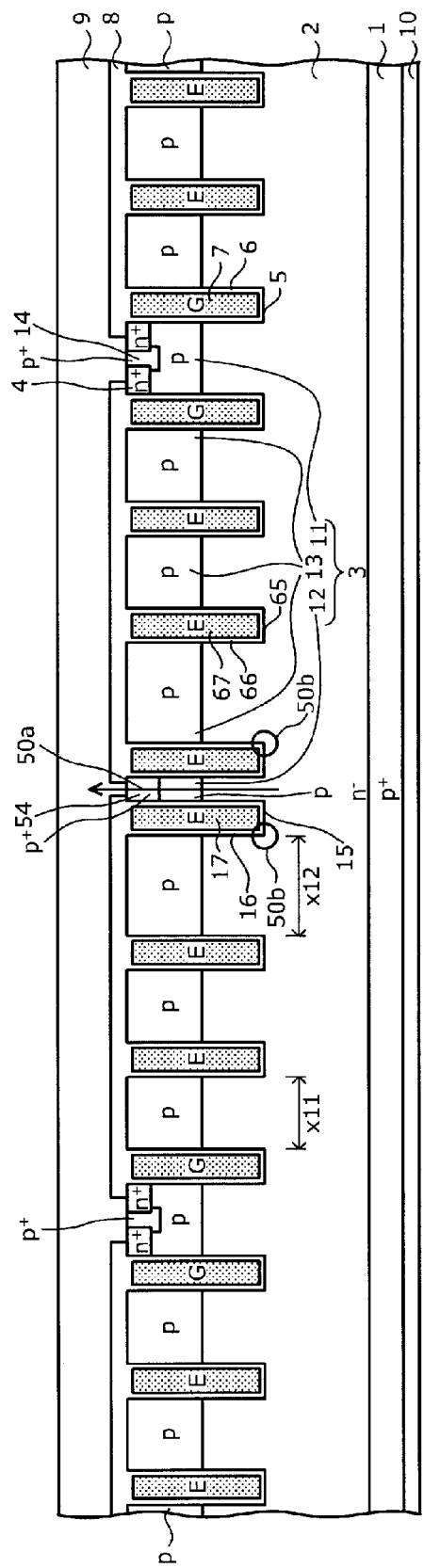
FIG. 9 is a sectional view showing the structure of a semiconductor device according to Embodiment 8.

Next, a description will be given of the structure of a semiconductor device according to Embodiment 8. FIG. 9 is a sectional view showing the structure of the semiconductor device according to Embodiment 8. The semiconductor device according to Embodiment 8 differs from the semiconductor device according to Embodiment 1 in that an emitter potential dummy trench (a fourth trench 65 in which a fourth gate electrode 67 is provided across a fourth gate insulating film 66) is disposed between the first trench 5 and second trench 15, separated from the second trench 15 by a distance x12 greater than a distance x11 between the dummy trench and the first trench 5 (x11<x12). By a multiple of the emitter potential dummy trench being provided in positions nearer to the first trench 5 than to the second trench 15, the breakdown voltage of the second p-type base region 12 is lower than the breakdown voltage of the first p-type base region 11, so that breakdown occurs in the second p-type base region 12.

Specifically, a multiple of the fourth trench 65 are provided between the first trench 5 and second trench 15, penetrating the floating p-type region 13 in the depth direction to reach the n--type drift layer 2. The multiple of the fourth trench 65 are disposed in a stripe form planar layout the same as that of the first and second trenches 5 and 15. FIG. 9 shows as an example a case wherein two of the fourth trench 65 are provided in each floating p-type region 13, but it is sufficient that one or more of the fourth trench 65 are provided in each floating p-type region 13. Inside the fourth trench 65, the fourth gate insulating film 66 is provided along the inner wall of the fourth trench 65, and the fourth gate electrode 67, which is formed of, for example, polysilicon, is provided on the inner side of the fourth gate insulating film 66. The fourth gate electrode 67, for example, is in conductive contact with the emitter electrode 9 in the vicinity of the outer periphery of the chip (not shown), thus having emitter potential.

The repetition pitch of the fourth trench 65 and the distance x11 between a neighboring fourth trench 65 and first trench 5 are, for example, practically equal to the width of the first p-type base region 11 between first trenches 5. That is, the first and fourth trenches 5 and 65 may be disposed at repetition pitches of practically equal intervals. A depletion layer spreading from the p-n junction between the floating p-type region 13 and n--type drift layer 2 to the n--type drift layer 2 side is practically flat along the p-n junction plane between a portion of the floating p-type region 13 in which the fourth trench 65 is provided and the n--type drift layer 2 and along the bottom surfaces of the first and fourth trenches 5 and 65. Therefore, in the same way as in Embodiment 7, electrical field concentration at the floating p-type region 13 side bottom surface corner portion of the first trench 5 can be relaxed, because of which the breakdown voltage of the first p-type base region 11 is increased.

Meanwhile, the distance x12 between a neighboring fourth trench 65 and second trench 15 is greater than the distances between other neighboring trenches (that is, the distance x11 between a neighboring fourth trench 65 and first trench 5, the width of the first p-type base region 11 between first trenches 5, and the width of the second p-type base region 12 between second trenches 15). Therefore, a depletion layer spreading to the n--type drift layer 2 side from the p-n junction between the floating p-type region 13 and n--type drift layer 2 is in a curved state along the p-n junction plane between a portion of the floating p-type region 13 sandwiched between the fourth trench 65 and second trench 15 and the n--type drift layer 2 and along the second trench 15. That is, in the same way as in Embodiment 7, avalanche breakdown is liable to occur at the floating p-type region 13 side bottom surface corner portion 50b of the second trench 15, so that breakdown when overvoltage is applied occurs preferentially in the second p-type base region 12.

As heretofore described, according to Embodiment 8, the same advantages as in Embodiments 1, 2, and 7 can be obtained.

Embodiment 9

Figure 10:
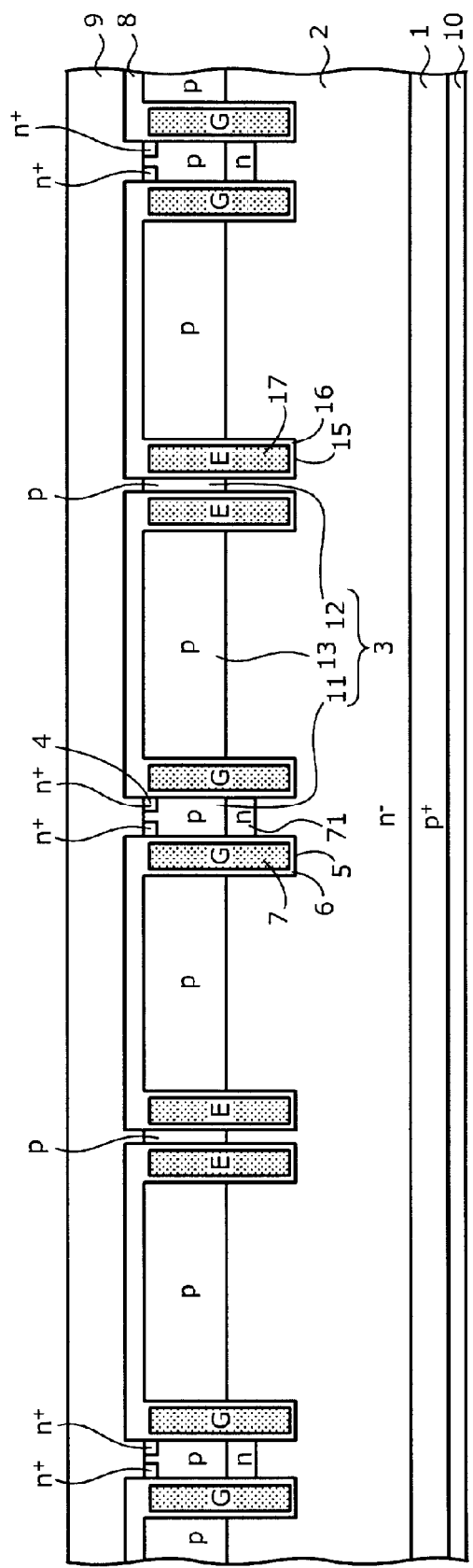
FIG. 10 is a sectional view showing the structure of a semiconductor device according to Embodiment 9.

Next, a description will be given of the structure of a semiconductor device according to Embodiment 9. FIG. 10 is a sectional view showing the structure of the semiconductor device according to Embodiment 9. The semiconductor device according to Embodiment 9 differs from the semiconductor device according to Embodiment 1 in that an n-type region (hereafter referred to as an n-type hole barrier region (seventh semiconductor layer)) 71 of an impurity concentration higher than that of the n--type drift layer 2 is provided between the first p-type base region 11 and n--type drift layer 2 in a mesa region between neighboring first trenches 5. The interface between the n-type hole barrier region 71 and n--type drift layer 2 is positioned in a position less deep than the bottom surface of the first trench 5 from the chip front surface.

The n-type hole barrier region 71 forms an impediment (barrier) to holes that are implanted from the collector electrode 10 into the n--type drift layer 2 and move toward the emitter electrode 9 when in an on-state. Therefore, the chip front surface side carrier concentration of the n--type drift layer 2 can be increased when in an on-state by providing the n-type hole barrier region 71. As excess carriers on the chip front surface side of the n--type drift layer 2 are expelled at high speed by an electrical field inside a depletion layer spreading from the p-n junction between the first p-type base region 11 and n-type hole barrier region 71 when turning off, the excess carriers do not contribute to a tail current when turning off. Therefore, the on-state voltage can be reduced, while restricting an increase in turn-off loss to a minimum.

The impurity concentration of the n-type hole barrier region 71 is higher than the impurity concentration of the n--type drift layer 2. It is preferable that the peak impurity concentration of the n-type hole barrier region 71 is within a range of in the region of $1\times10^{16}/cm^3$ or more, $1\times10^{17}/cm^3$ or less. The n-type hole barrier region 71 is not provided in a mesa region between neighboring second trenches 15 (that is, between the second p-type base region 12 and n--type drift layer 2). The n-type hole barrier region 71 may be provided between the floating p-type region 13 and n--type drift layer 2 in a mesa region between neighboring first and second trenches 5 and 15. No change occurs in electrical characteristics due to the existence or otherwise of the n-type hole barrier region 71 in a mesa region between neighboring first and second trenches 5 and 15.

Figure 11:
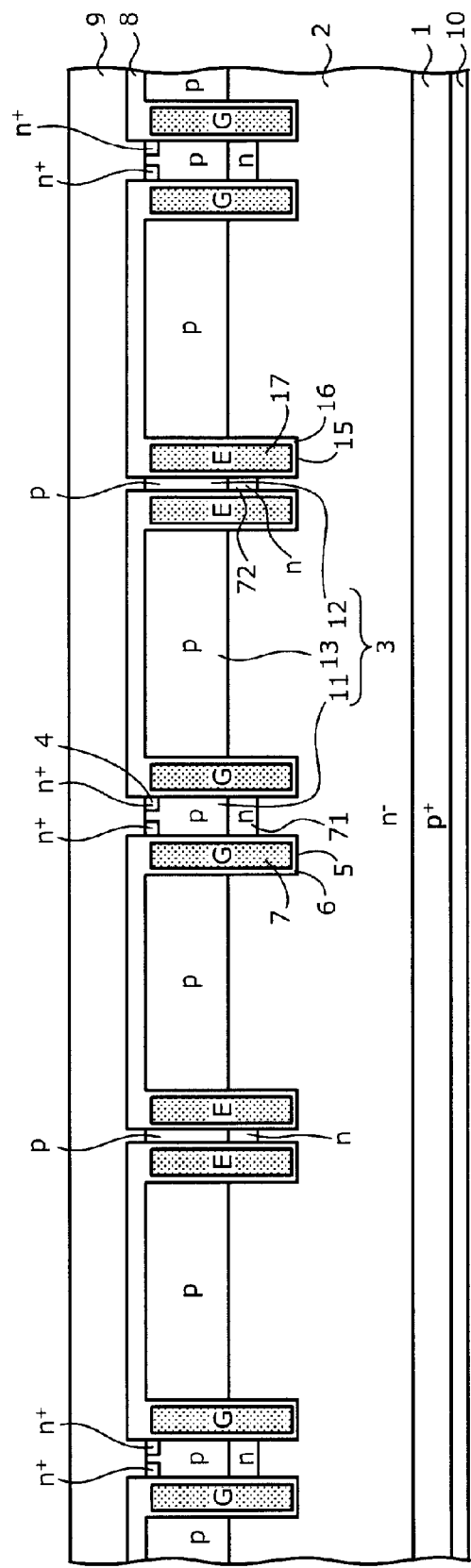
FIG. 11 is a sectional view showing the structure of a semiconductor device of a comparison example.

Next, a description will be given of a turn-on operation of the semiconductor device (trench gate IGBT) according to Embodiment 9, comparing with the trench gate IGBT of a comparison example shown in FIG. 11. FIG. 11 is a sectional view showing the structure of the semiconductor device of the comparison example. In Embodiment 9, in the same way as in Embodiment 1, a layer of accumulated holes is formed inside the floating p-type region 13 when turning on, and the potential of the floating p-type region 13 rises. When the potential of the floating p-type region 13 between the first and second trenches 5 and 15 rises, the second gate insulating film 16 inside the second trench 15 is reverse biased, because of which a p-type inversion layer connecting the floating p-type region 13 and second p-type base region 12 is formed in the vicinity of the bottom surface of the second trench 15. At this time, when an n-type hole barrier region 72 is provided between the second p-type base region 12 and n--type drift layer 2 in a mesa region between neighboring second trenches 15, as in the comparison example shown in FIG. 11, a p-type inversion layer connecting the floating p-type region 13 and second p-type base region 12 is unlikely to be formed. Configurations of the comparison example other than the n-type hole barrier region 72 are the same as those of Embodiment 9.

Therefore, Embodiment 9 is such that, by providing the n-type hole barrier region 71 only in a mesa region (between the first p-type base region 11 and n--type drift layer 2) between neighboring first trenches 5, the problem occurring in the comparison example of a p-type inversion layer being unlikely to be formed is eliminated. Therefore, in the same way as in Embodiment 1, a rise in the potential of the floating p-type region 13 can be restricted, whereby a rise in the gate voltage is restricted. Therefore, it is possible to prevent a worsening of controllability by gate resistance of the reverse recovery dV/dt of a body diode (FWD: free wheeling diode), formed of the first p-type base region 11, n-type hole barrier region 71, and n--type drift layer 2, connected in anti-parallel to the IGBT. Also, owing to the n-type hole barrier region 71 being provided only in a mesa region between neighboring first trenches 5, there is no restriction of the extension of a depletion layer spreading from the p-n junction between the second p-type base region 12 and n--type drift layer 2 when voltage is applied between the collector and emitter. Therefore, the gate-emitter capacitance can be maintained at a capacitance of the same extent as in Embodiment 1, and turn-on loss can thus be prevented from increasing.

Figure 12:
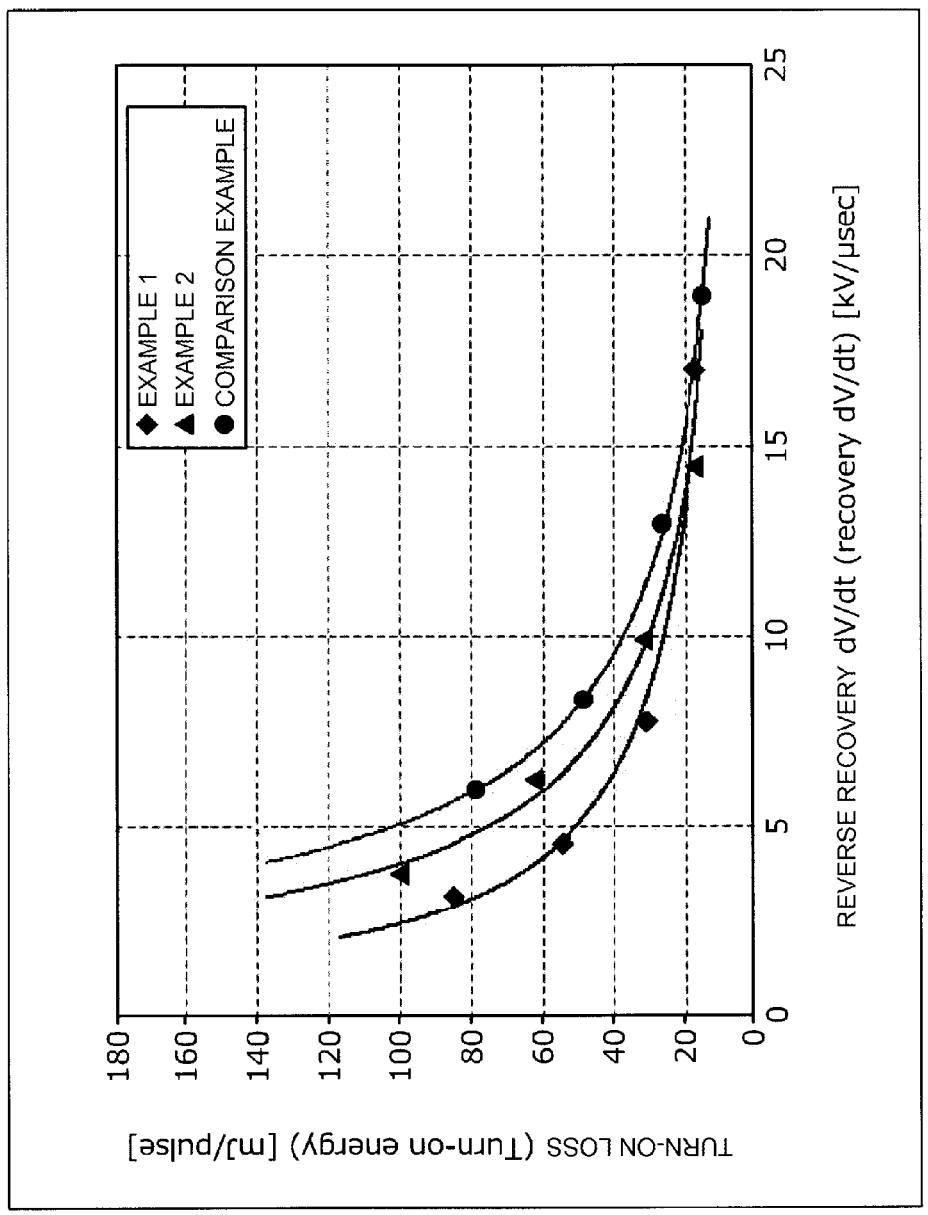
FIG. 12 is a characteristic diagram showing the trade-off relationship between turn-on loss and reverse recovery dV/dt.

Next, the trade-off relationship between turn-on loss and the body diode reverse recovery dV/dt will be verified for the semiconductor device according to Embodiment 9 (hereafter referred to as Example 2). FIG. 12 is a characteristic diagram showing the trade-off relationship between turn-on loss and reverse recovery dV/dt. The reverse recovery dV/dt per microsecond (kV/μsec) is shown on the horizontal axis of FIG. 12, while the turn-on loss per pulse (mJ/pulse) is shown on the vertical axis. The semiconductor device according to Embodiment 1 (hereafter referred to as Example 1, refer to FIG. 1) and the comparison example (refer to FIG. 11) are shown as comparisons in FIG. 12. That is, Example 1, which does not include the n-type hole barrier region 71, Example 2, which includes the n-type hole barrier region 71, and the comparison example, which includes the n-type hole barrier regions 71 and 72, are shown in FIG. 12.

Examples 1 and 2 and the comparison example are all driven with voltage Vcc applied between the collector and emitter when turning off at 600V, and gate voltage Vg at +15V/−15V. Further, turn-on loss Eon is measured with collector current Ic at 150 A and junction temperature Tj at 150° C. Also, the body diode reverse recovery dV/dt is measured with forward current If at 15 A, and the junction temperature Tj at room temperature (for example, in the region of 25° C.).

From the results shown in FIG. 12, it is confirmed that the trade-off between turn-on loss and reverse recovery dV/dt can be improved further in both Examples 1 and 2 than in the comparison example. Also, although omitted from the drawing, it is confirmed that in Example 2, although the trade-off between turn-on loss and reverse recovery dV/dt cannot be improved to the same extent as in Example 1, the trade-off between turn-off loss and on-state voltage can be improved further than in Example 1 owing to the n-type hole barrier region 71 being provided.

As heretofore described, according to Embodiment 9, the same advantages as in Embodiment 1 can be obtained. Also, according to Embodiment 9, worsening of the trade-off between turn-on loss and dV/dt (noise) can be restricted to a minimum, and the trade-off between turn-off loss and on-state voltage can be improved.

The invention, not being limited to the heretofore described embodiments, is applicable to insulated gate semiconductor devices of various configurations. For example, an n+-type field stop region may be disposed in a position deeper from the semiconductor chip back surface than the p+-type collector region in the semiconductor devices according to Embodiments 1 to 5, 7, and 8. Also, the configuration of Embodiment 3 may be applied to the semiconductor devices according to Embodiments 1, 2, and 4 to 8, while the configuration of Embodiment 4 may be applied to the semiconductor devices according to Embodiments 1 to 3 and 5 to 8. Also, the configuration of Embodiment 9 may be applied to Embodiments 2 to 8. Also, in each embodiment, a first conductivity type is p-type and a second conductivity type is n-type, but the invention is established in the same way when the first conductivity type is n-type and the second conductivity type is p-type.

As heretofore described, the semiconductor device according to the embodiment is useful in a power semiconductor device used in a power conversion device or the like,

What is claimed is:

1. A semiconductor device, comprising:
   a first conductivity type first semiconductor layer;
   a second conductivity type second semiconductor layer provided on the first semiconductor layer;
   a first conductivity type third semiconductor layer selectively provided in a surface layer of the second semiconductor layer on a side opposite to that of the first semiconductor layer;
   a second conductivity type fourth semiconductor layer selectively provided inside the third semiconductor layer;
   a first trench penetrating the third semiconductor layer and fourth semiconductor layer to reach the second semiconductor layer;
   a first conductivity type fifth semiconductor layer, selectively provided in a surface layer of the second semiconductor layer on the side opposite to that of the first semiconductor layer, separated from the third semiconductor layer by the first trench;
   a second trench reaching the second semiconductor layer from the surface of the fifth semiconductor layer on the side opposite to that of the first semiconductor layer;
   a first conductivity type sixth semiconductor layer, provided inside the fifth semiconductor layer, separated from the fifth semiconductor layer by the second trench;
   an emitter electrode conductively connected to the third semiconductor layer, fourth semiconductor layer, and sixth semiconductor layer and electrically isolated from the fifth semiconductor layer;
   a collector electrode conductively connected to the first semiconductor layer;
   a first gate electrode provided across a first gate insulating film inside the first trench; and
   a second gate electrode provided across a second gate insulating film inside the second trench and electrically connected to the emitter electrode,
   wherein the sixth semiconductor layer has a width that is less than that of the third semiconductor layer.

2. The semiconductor device according to claim 1, wherein the fifth semiconductor layer has a depth that is greater than that of the first trench and second trench.

3. The semiconductor device according to claim 2, further comprising:
   a second conductivity type seventh semiconductor layer, having an impurity concentration that is higher than that of the second semiconductor layer, provided between the third semiconductor layer and second semiconductor layer between neighboring first trenches.

4. The semiconductor device according to claim 1, wherein the first trench is disposed in stripe form, and the third semiconductor layer and fifth semiconductor layer extend linearly in parallel with a direction in which the stripe of the first trench extends.

5. The semiconductor device according to claim 4, wherein the second trench is disposed linearly in parallel with the direction in which the stripe of the first trench extends, and the sixth semiconductor layer extends linearly in parallel with the direction in which the stripe of the first trench extends.

6. The semiconductor device according to claim 5, further comprising:
   a second conductivity type seventh semiconductor layer, having an impurity concentration that is higher than that of the second semiconductor layer, provided between the third semiconductor layer and second semiconductor layer between neighboring first trenches.

7. The semiconductor device according to claim 4, wherein a plurality of the sixth semiconductor layer are disposed at predetermined intervals in the direction in which the stripe of the first trench extends, and the second trench is disposed so as to surround each of the plurality of the sixth semiconductor layer.

8. The semiconductor device according to claim 7, further comprising:
   a second conductivity type seventh semiconductor layer, having an impurity concentration that is higher than that of the second semiconductor layer, provided between the third semiconductor layer and second semiconductor layer between neighboring first trenches.

9. The semiconductor device according to claim 4, further comprising:
   a second conductivity type seventh semiconductor layer, having an impurity concentration that is higher than that of the second semiconductor layer, provided between the third semiconductor layer and second semiconductor layer between neighboring first trenches.

10. The semiconductor device according to claim 1, further comprising:
    a third trench penetrating the fifth semiconductor layer to reach the second semiconductor layer between the first trench and second trench; and
    a third gate electrode provided across a third gate insulating film inside the third trench and electrically connected to the emitter electrode,
    wherein a portion of the fifth semiconductor layer sandwiched by the first trench and third trench has a width that is less than that of the third semiconductor layer.

11. The semiconductor device according to claim 10, further comprising:
    a second conductivity type seventh semiconductor layer, having an impurity concentration that is higher than that of the second semiconductor layer, provided between the third semiconductor layer and second semiconductor layer between neighboring first trenches.

12. The semiconductor device according to claim 1, wherein the fifth semiconductor layer has a depth such that a first trench side portion is deeper than a second trench side portion, and a fifth semiconductor layer side bottom surface corner portion of the first trench is covered by the first trench side portion of the fifth semiconductor layer.

13. The semiconductor device according to claim 12, further comprising:
a second conductivity type seventh semiconductor layer, having an impurity concentration that is higher than that of the second semiconductor layer, provided between the third semiconductor layer and second semiconductor layer between neighboring first trenches.

14. The semiconductor device according to claim 1, further comprising:
a fourth trench penetrating the fifth semiconductor layer to reach the second semiconductor layer between the first trench and second trench; and
a fourth gate electrode provided across a fourth gate insulating film inside the fourth trench and electrically connected to the emitter electrode,
wherein the fourth trench and second trench have a distance there between that is greater than that between the fourth trench and first trench.

15. The semiconductor device according to claim 14, further comprising:
a second conductivity type seventh semiconductor layer, having an impurity concentration that is higher than that of the second semiconductor layer, provided between the third semiconductor layer and second semiconductor layer between neighboring first trenches.

16. The semiconductor device according to claim 1, further comprising:
a second conductivity type seventh semiconductor layer, having an impurity concentration that is higher than that of the second semiconductor layer, provided between the third semiconductor layer and second semiconductor layer between neighboring first trenches.

17. A semiconductor device, comprising:
a first conductivity type first semiconductor layer;
a second conductivity type second semiconductor layer provided on the first semiconductor layer;
a first conductivity type third semiconductor layer selectively provided in a surface layer of the second semiconductor layer on the side opposite to that of the first semiconductor layer;
a second conductivity type fourth semiconductor layer selectively provided inside the third semiconductor layer;
a first trench penetrating the third semiconductor layer and fourth semiconductor layer to reach the second semiconductor layer;
a first conductivity type fifth semiconductor layer, selectively provided in a surface layer of the second semiconductor layer on the side opposite to that of the first semiconductor layer, separated from the third semiconductor layer by the first trench;
a second trench reaching the second semiconductor layer from the surface of the fifth semiconductor layer on the side opposite to that of the first semiconductor layer;
a first conductivity type sixth semiconductor layer, provided inside the fifth semiconductor layer, separated from the fifth semiconductor layer by the second trench;
an emitter electrode conductively connected to the third semiconductor layer, fourth semiconductor layer, and sixth semiconductor layer and electrically isolated from the fifth semiconductor layer;
a collector electrode conductively connected to the first semiconductor layer;
a first gate electrode provided across a first gate insulating film inside the first trench; and
a second gate electrode provided across a second gate insulating film inside the second trench and electrically connected to the emitter electrode,
wherein a plurality of the sixth semiconductor layer are disposed at predetermined intervals in the direction in which the stripe of the first trench extends, and the second trench is disposed so as to surround each of the plurality of the sixth semiconductor layer.

* * * * *